United States Patent [19]
Kaneaki et al.

[11] Patent Number: 5,124,703
[45] Date of Patent: Jun. 23, 1992

[54] DIGITAL SIGNAL REQUANTIZING CIRCUIT USING MULTISTAGE NOISE SHAPING

[75] Inventors: Tetsuhiko Kaneaki, Ashiya; Tsuyoshi Takayama, Osaka, both of Japan

[73] Assignee: Matsushita Electric Industrial Co., Ltd., Japan

[21] Appl. No.: 680,668

[22] Filed: Apr. 5, 1991

[30] Foreign Application Priority Data

| Apr. 5, 1990 | [JP] | Japan | 2-90868 |
| Apr. 6, 1990 | [JP] | Japan | 2-92420 |
| May 24, 1990 | [JP] | Japan | 2-134404 |
| Jun. 25, 1990 | [JP] | Japan | 2-167243 |

[51] Int. Cl.$^5$ .............................. H03M 3/04
[52] U.S. Cl. ..................... 341/77; 341/143; 375/27
[58] Field of Search .............. 375/26, 28, 27, 29, 375/33, 34; 341/76, 77, 143

[56] References Cited

U.S. PATENT DOCUMENTS

| 4,704,600 | 11/1987 | Uchimura | 341/143 X |
| 5,027,119 | 6/1991 | Toyomaki | 341/143 X |

FOREIGN PATENT DOCUMENTS

| 0308194 | 9/1987 | European Pat. Off. | 341/143 |
| 63-209334 | 8/1988 | Japan . | |
| 63-248222 | 10/1988 | Japan | 341/143 |

OTHER PUBLICATIONS

"A 17-Bit Oversampling D-to-A Conversion Technology Using Multistage Noise Shaping", by Yasuyuki Matsuya et al., IEEE Journal of Solid-State Circuits, vol. 24, No. 4, Aug. 1989.

Primary Examiner—Howard L. Williams
Attorney, Agent, or Firm—Lowe, Price, LeBlanc & Becker

[57] ABSTRACT

In a digital signal noise shaping requantization circuit formed of a first delta-sigma quantizer (main loop) for executing noise shaping of an input digital signal and a second delta-sigma quantizer (sub-loop) which receives as input signal the quantization error of a local quantizer in the first delta-sigma quantizer, and whose output signal is differentiated and added to the output signal from the first delta-sigma quantizer, the second delta-sigma quantizer includes a feedback circuit for operating on a quantization error of a local quantizer therein, with a predetermined transfer function. The output signal from the feedback circuit, in addition to being fed back to the input of the second delta-sigma quantizer, is also applied to control the operation of the first delta-sigma quantizer such as to modify the value of quantization error of the local quantizer of the first delta-sigma quantizer, for thereby ensuring stable and effective operation of the second delta-sigma quantizer even when the input digital signal attains a high amplitude.

14 Claims, 11 Drawing Sheets

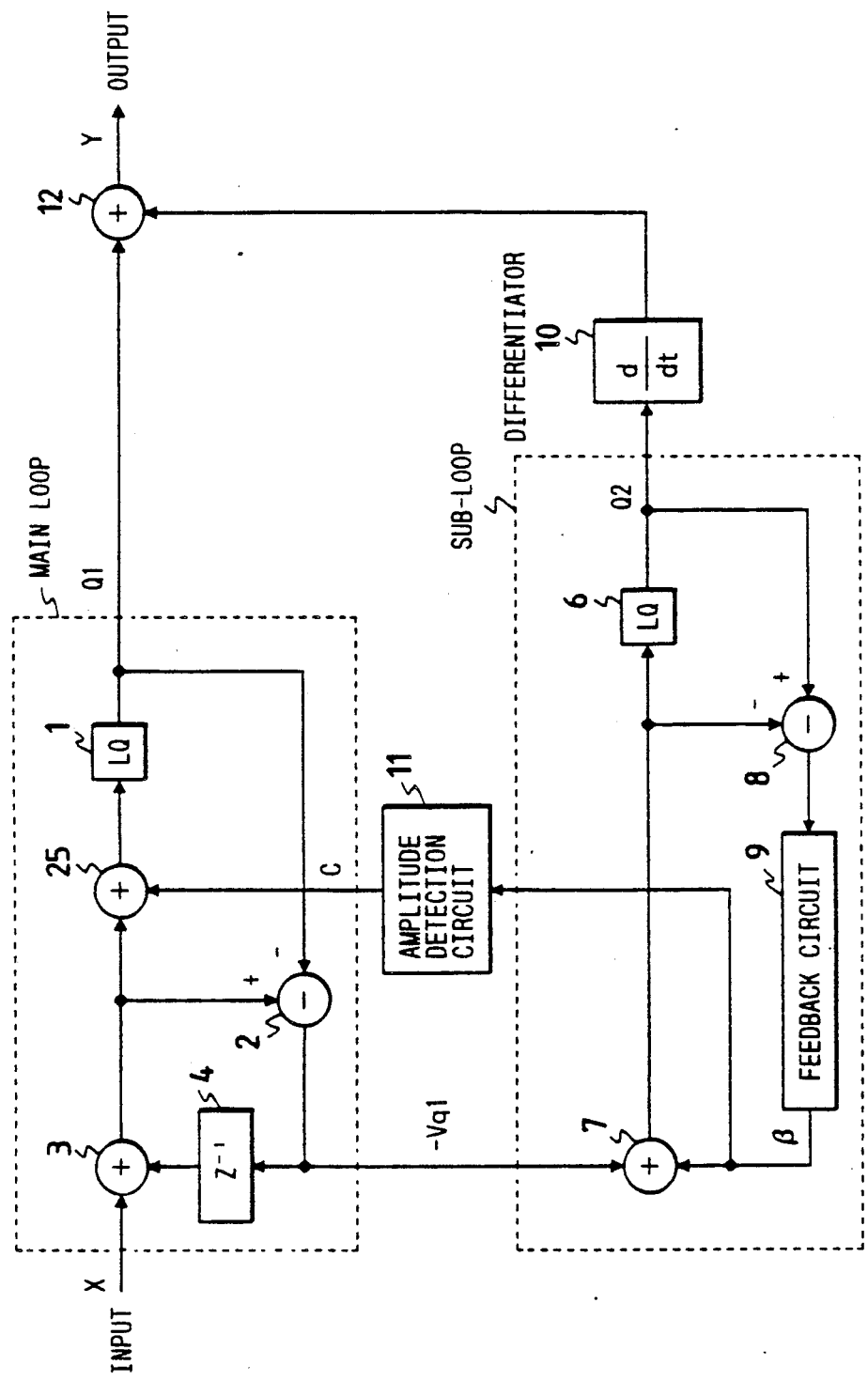

DIGITAL SIGNAL REQUANTIZING CIRCUIT USING MULTISTAGE NOISE SHAPING

BACKGROUND OF THE INVENTION

1. Field of the Invention

The present invention relates to a digital signal noise shaping requantizing circuit, and in particular to a noise shaping requantizing circuit which utilizes a multi-stage noise shaping technique.

2. Description of the Related Art

In recent years, in accompaniment with advances that have been made is digital signal processing technology, digital signal processing has come increasingly into use in fields where analog signal processing was previously utilized. Requirements have therefore arisen for improved performance of digital-to-analog converters, and for these to be produced at lower cost. Noise shaping quantization is a technique that has been developed to meet these requirements. An example of a noise shaping quantizer circuit is described in Japanese Patent Laid-open No. 63-209334, with the title "Quantizer Using Noise Shaping". That circuit uses multi-stage noise shaping, i.e. whereby a quantization error generated in a first delta-sigma quantizer which executes noise shaping of an input signal is inputted to a second delta-sigma quantizer, whose output signal is differentiated and added to the output from the first delta-sigma quantizer. Such a circuit enables high-order noise shaping to be achieved without the danger of oscillation occurring in the circuit. However it has the disadvantage of requiring a higher degree of quantization resolution of the output signal, by comparison with a quantization circuit which provides only low-order noise shaping (e.g. a circuit consisting of only one single-integration delta-sigma quantizer). For that reason, new types of quantization circuit have been proposed, for example as described in the I.E.E.E. Journal of Solid State Circuits, August 1989, Vol. 24 No. 4, whereby it becomes unnecessary to increase the degree of quantization resolution of the output from the circuit (i.e. by comparison with a circuit which provides only low-order noise shaping), in order to achieve high-order noise shaping operation.

That circuit is shown in FIG. 18, implemented as a noise shaping requantizing circuit, i.e. a circuit which converts an input digital signal having a high value of quantization resolution to an output digital signal having a lower value of quantization resolution and a higher sampling frequency than that of the input signal. In FIG. 18, the input digital signal is designated as X, and the output digital signal as Y. A digital integrator 102 is formed of a delay element 127 (providing a unit delay, represented by the delay operator $z^{-1}$, that is equal to the sampling period of the input digital signal) and an adder 126. That integrator 102, in conjunction with a local quantizer 103, an adder 128, a delay element 4, and a subtractor 101, forms a main loop 100 which constitutes a first-order delta-sigma quantizer, sometimes referred to as a single-integration delta-sigma quantizer. An adder 120 and a delay element 121 form an integrator 108, while an adder 122 and a delay element 123 form an integrator 110. A subtractor 107 and a subtractor 109, a local quantizer 111, the integrators 108 and 110, and a delay element 112 form a sub-loop 106 which constitutes a second-order delta-sigma quantizer, sometimes referred to a single-integration delta-sigma quantizer. In the sub-loop 106, the subtractor 2 derives the difference between the input and output signals of the local quantizer 103. In addition, the output signal produced from the integrator 108 is multiplied by a predetermined coefficient "a" by a multiplier 130, and the result is added to the input signal of the local quantizer 103 by the adder 128. It will be assumed that the input signal X is a 16-bit digital signal, and that the quantization that is executed by the local quantizers 103 and 111 is expressed by the appended Tables 1 and 2, respectively. The output values are normalized to 16384.

Designating the quantization error of the local quantizer 103 as Vq1, and the quantization error of the local quantizer 111 as Vq2, the input signal X and the output signal Q1 from the main loop 100 have the following relationship:

$$Q1 = X + (1-z^{-1}) \cdot Vq1 \tag{1}$$

The input signal X' and the output signal Q2 of the sub-loop 106 are related as follows:

$$Q2 = X' + (1-z^{-1})^2 \cdot Vq2 \tag{1}$$

Since the output produced from the subtractor 2 is the difference between the input and output signal values of the local quantizer 103, the following is true:

$$X' = -Vq1 \tag{3}$$

The output Q2 from the sub-loop 106 is therefore differentiated by the digital signal differentiator 10 (made up of an adder 13 and a delay element 14), and the result is added to the output signal Q1 from the main loop 100, by the adder 12. As a result, the Vq1 term in equation (1) above is cancelled out, so that the overall relationship between the input digital signal X and the output digital signal Y of the circuit is expressed by the following equation:

$$Y = X + (1-z^{-1})^3 \cdot Vq2 \tag{4}$$

Such a circuit provides stable operation, irrespective of the fact that the quantization resolution of the sub-loop 106 is low, i.e. the output signal from that sub-loop can take only the two values +0.5. The reasons for that stability are as follows. The output value produced from the integrator 108, after being multiplied by the factor "a" in the factor multiplier 130, is fed back through the adder 128 to the local quantizer 103. Thus, when the output value from the integrator 108 is large, the input value that is supplied to the local quantizer 103 will also be large, and hence the resultant output value that is produced from the subtractor 2 will be a large negative value. That large negative value is applied through the subtractor 107 to the integrator 108, while the other input of the subtractor 107 is at a value whose maximum possible value is 0.5. Thus the subtractor 107 supplies a large negative value to the integrator 108, and hence the output from the integrator 108 will gradually become smaller.

In this way, since feedback is applied to the main loop 100 in a direction such as to reduce the magnitude of the output value from the integrator 108, the output from the 110 is restricted to at a small range of values, so that the quantization resolution of the local quantizer 111 can be made low. In this way, the values of the output signal Q1 from the main loop 100 can be established as −2, −1, . . . +2, i.e. a total of five values, while the values of the output signal Q2 from the sub-loop 106 can be established as −0.5 and +0.5, i.e. a total of two values. Hence, the output values of the output signal Y from the overall noise shaping requantizing circuit are −3, −2, . . . +3, i.e. a total of 7 values. Thus the input digital signal has been compressed to a range of 7 possible values, which can be expressed by 3 bits. Furthermore, equation (4) expresses the fact that the quantization error in the low frequency range has been moved to a high frequency range. Thus, the configuration shown in FIG. 18 provides the desired noise shaping operation, together with a compression of the number of bits required to represent the digital signal, and with no reduction of the dynamic range. When used with 64-times oversampling, for example, such a circuit provides a dynamic range of approximately 118 dB.

However with such a prior art noise shaping requantizing circuit, each time that a new output value begins to be produced from the integrator 108 in the sub-loop 106, signal operations are then again executed along a path which is, successively, from the output of the integrator 108-factor multiplier 130-adder 128-local quantizer 103-subtractor 2-subtractor 107-subtractor 109-integrator 110-local quantizer 111. Thus, high-speed operation is not achievable with such a configuration, i.e. there is a relatively long internal processing time for the feedback that is applied from the output of the integrator 108. In addition, the feedback is applied only from the output of the first stage integrator 108, and no feedback is applied from the next stage integrator, i.e. the integrator 110. Hence, this amounts to a condition in which no measures are taken to prevent oscillation or overflow from occurring for the integrator 110. Such problems are especially severe when the input digital signal is at a high level, and so result in a reduction of the dyamic range that can be achieved. Due to such problems of instability or overflow, it becomes difficult to use a sub-loop which has a third order (or higher order) noise shaping coefficent.

Specifically, when the level of the input signal X of the circuit is at a high value such as 0 dB (i.e. when the input signal level is close to 32768), the feedback that is applied by the factor multiplier 130 and the adder 128 becomes less effective. As a result, the noise level of the output signal is increased, and harmonic distortion is produced. With the circuit of FIG. 18, this results in a deterioration of approximately 25 dB in the noise level. To prevent that, it is necessary to limit the maximum amplitude of the input signal X to be less than 0 dB, and hence the dynamic range is reduced.

SUMMARY OF THE INVENTION

It is an objective of the present invention to overcome the disadvantages of the prior art as set out above, by providing a noise shaping requantizing circuit which can provide faster feedback control for ensuring stability of operation, while enabling similar noise shaping performance to be achieved to that of a prior art noise shaping requantizing circuit employing multi-stage noise shaping, and whereby no appreciable deterioration of performance occurs when an input signal level close to 0 dB is applied, and moreover whereby it becomes possible to achieve a fourth-order or higher-order noise shaping coefficient, together with stable operation even when a high-amplitude input signal is applied.

To achieve the above objectives, the present invention provides a noise shaping requantizing circuit, requantizing of said input digital signal, said delta-sigma quantizer including a first local quantizer and means for detecting a quantization error of the first local quantizer;

a second local quantizer and detection means for detecting a quantization error of the second local quantizer;

a feedback circuit for multiplying said quantization error of the second local quantizer by a predetermined transfer function $H(z)$ to obtain a feedback quantity;

adder means for adding together said feedback quantity and quantization error of the first local quantizer to produce an input signal of said second local quantizer;

means for controlling said quantization error generated by the first local quantizer, in accordance with said feedback quantity, such as to ensure correct operation of said second delta-sigma quantizer; and differentiator means for differentiating an output signal produced from said second local quantizer, with an order of differentiation that is in accordance with an order of noise shaping executed by said delta-sigma quantizer, and adder means for adding together an output signal produced from said differentiator means and an output signal from the first local quantizer, to obtain a final output signal.

Thus with such a noise shaping requantizing circuit, the output signal produced from a feedback circuit in a sub-loop can control the value of quantization error produced by a local quantizer of a delta-sigma quantizer which constitutes a main loop, for example by being added to or subtracted from an input or output signal of that local quantizer, such that the quantization error is opposite in polarity to the output from feedback circuit. Hence, since the result of adding together the quantization error generated by the delta sigma quantizer (that executes noise shaping of the input digital signal) and the output value from the feedback circuit is inputted to the sub-loop, the absolute value of the input level of the local quantizer of the sub-loop is made always smaller than the output value from the feedback circuit. This enables the quantization resolution of the local quantizer of the sub-loop to be made low, even when a high-order delta-sigma quantizer is used as the sub-loop.

Due to the fact that the range of output values from the feedback circuit is predetermined, the signal processing time within the circuit can be made short. In addition, the upper and lower limit values of the of the sub-loop is made always smaller than the output value from the feedback circuit. Thus, since only a predetermined restricted range of signal values can be inputted to the local quantizer of the sub-loop, the quantization resolution of that local quantizer can be made low, even when high-order noise shaping operation is executed.

Moreover, due to the fact that the range of output values from the feedback circuit is predetermined, the signal processing time of feedback operation can be made short. In addition, the upper and lower limit values of the output signal from the local quantizer of the main loop can be expanded or contracted in accordance with the output from the differentiator that acts on the output signal from the sub-loop, thereby enabling satisfactory operation even when the level of the input signal to the noise shaping requantizing circuit is O dB or even higher, without danger of internal oscillation occurring.

BRIEF DESCRIPTION OF THE DRAWINGS

FIG. 6A is a block diagram of third embodiment of the invention.

DESCRIPTION OF PREFERRED EMBODIMENTS

Figure 1:
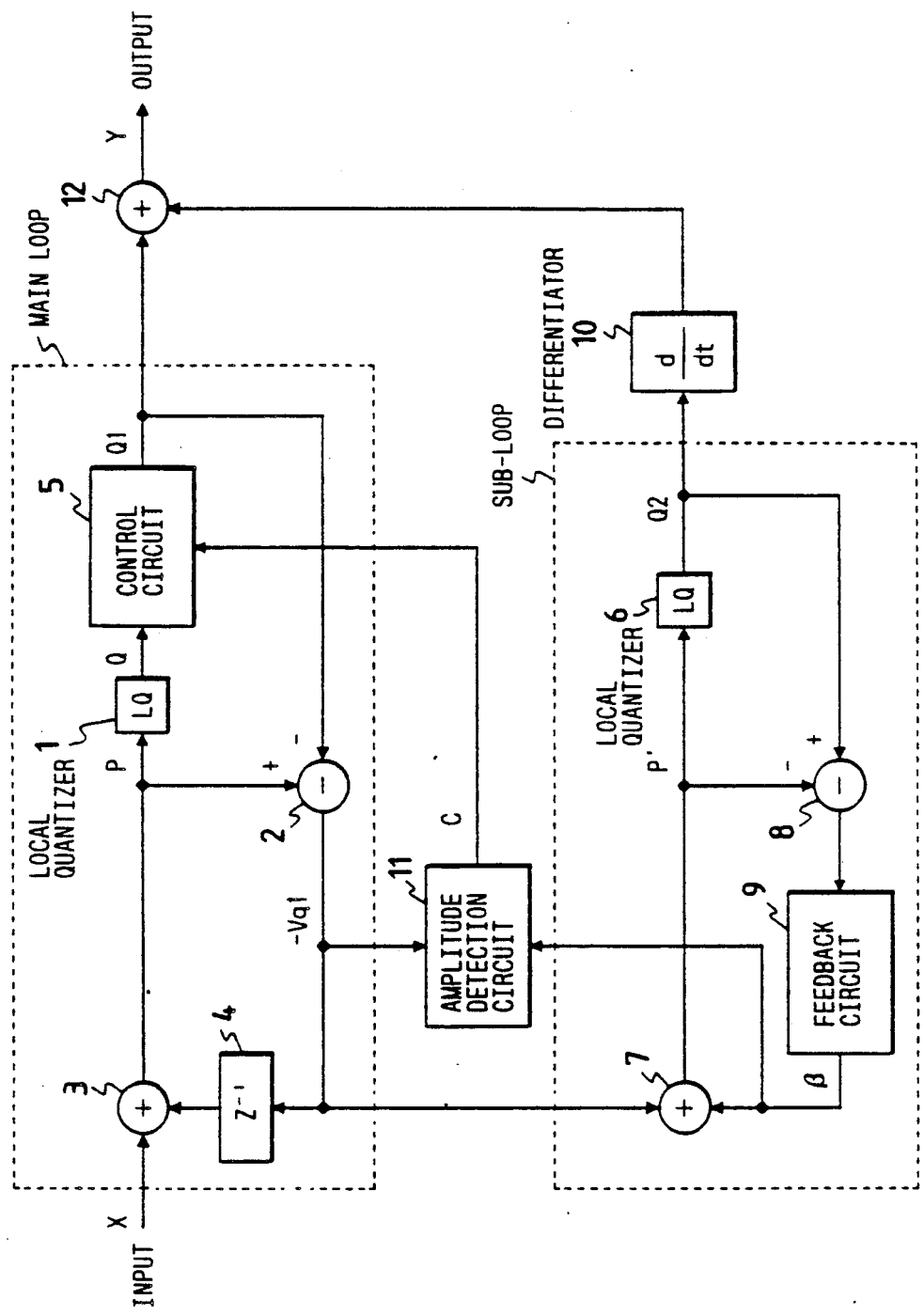
FIG. 1 is a block diagram of a first embodiment of a noise shaping requantizing circuit according to the present invention.

FIG. 1 is a block diagram of a first embodiment of a noise shaping requantizing circuit according to the present invention, which receives an input digital signal X and executes requantizing of the digital signal by oversampling, to produce an output digital signal Y having a lower degree of quantization resolution and a higher sampling frequency than those of the input digital signal X. In FIG. 1, numeral 1 denotes a local quantizer, having relationships between input and output signal values as set out in the appended Table 3. The output values are normalized at 11264. Designating the input and output signals of the local quantizer 1 as P and Q, the relationship between these can be expressed as follows:

$$Q = [(P+5632)/(11264)] \quad (5)$$

In the above, "[]" indicate Guassian symbols.

Figure 2:
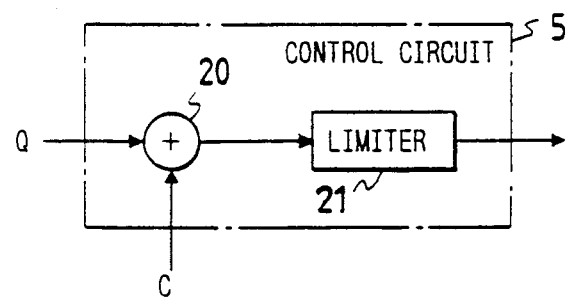
FIG. 2 is a block diagram showing details of a control circuit 5 in the first embodiment.

Numeral 5 denotes a control circuit in which the output from an amplitude detection circuit 11 (described hereinafter) and the local quantizer 1 are added together, with the configuration of the control circuit 5 being as shown in FIG. 2. As shown, the control circuit 5 is made up of a limiter 21 and an adder 20. The output signal C from the amplitude detection circuit 11 and the output signal Q from the local quantizer 1 are added together and the result is inputted to the limiter 21, which produces an output that is within the range −3 to +3.

The local quantizer 1, adder 3, subtractor 2 and a delay element 4 constitute a main loop, which functions as a delta-sigma quantizer, with the output signal Q from the local quantizer 1 being transferred through the control circuit 5 to be applied to an inverting (−) input of the subtractor 2 and the output signal from the adder 3 being applied to a non-inverting (+) input of the subtractor 2, the output signal −Vq1 from the subtractor 2 (i.e. the quantization error of the local quantizer 1) being transferred through the delay element 4 to one input of the adder 3, and the input signal X being applied to the other input of the adder 3. 6 denotes a local quantizer, having the relationships between input and output signal values set out in the aforementioned Table 3. Numeral 9 denotes a feedback circuit whose output value will be designated as the feedback quantity $\beta$, and having a transfer function $H(z)$ that can be expressed as follows:

$$H(z) = -2 \cdot z^{-1} + z^{-2} \quad (6)$$

The sub-loop in FIG. 1 constitutes a delta-sigma noise shaping quantizer, whose order is determined by the order of the transfer function of the feedback circuit 9.

Figure 3:
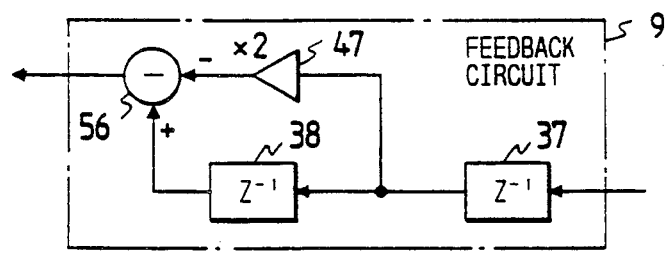
FIGS. 3 and 4 are block of specific configurations for a feedback circuit 9 in the first embodiment.

FIG. 3 shows an example of a specific configuration for the feedback circuit 9. As shown, the input signal to the feedback circuit 9 is transferred through a delay element 37 to be then multiplied by a factor of 2 in a multiplier 47. The output from the delay element 37 is also transferred through a second delay element 38, and the output signal obtained thereby is applied to one input of a subtractor 56, with the output signal from the multiplier 47 being applied to the other input of the subtractor 56. The circuit thereby produces an output value that is the difference between the outputs from the multiplier 47 and the delay element 38.

In FIG. 1, 11 denotes an amplitude detection circuit which receives the output signal from the subtractor 2 of the main loop, i.e. the main loop error signal −Vq1, and the output signal $\beta$ that is produced as a feedback quantity by the feedback circuit 9, and produces as output a 3-bit signal C whose bits will be designated as C2, C1 and C0. The values of these bits vary in accordance with the levels of the main loop quantization error −Vq1 and the feedback quantity $\beta$, as shown in the appended Table 4.

A local quantizer 6, adder 7, feedback circuit 9 and subtractor 8 constitute a sub-loop, which functions as a second delta-sigma quantizer, with the error signal −Vq1 from the main loop being applied to one input of the adder 7, the output signal from the adder 7 being applied to the "−" input of the subtractor 8 and to the local quantizer 6, the output signal Q2 from the local quantizer 6 being applied to the "+" input of the subtractor 8, and the output signal from the subtractor 8 being transferred through the feedback circuit 9 to the other input of the adder 7.

The operation of the circuit of FIG. 1 is as follows. The main loop executes first-order noise shaping, by the action of the adder 3, the local quantizer 1, the control circuit 5, the subtractor 2 and the delay element 4. Designating the quantization error that is produced by the operation of the combination of the local quantizer 1 and the control circuit 5 as Vq1, the output signal from the subtractor 2 will be −Vq1, which is transferred through the delay element 4 to be fed back to the input, i.e. to be added to the input signal X in the adder 3. Thus the output signal from the control circuit 5 is expressed (in the same way as for the prior art example of FIG. 14) by the following equation:

$$Q1 = X + (1-z^{-1}) \cdot Vq1 \quad (7)$$

Assuming that the feedback circuit 9 has a second-order transfer function, then second-order noise shaping will be executed by the sub-loop, formed of the local quantizer 6, adder 7, subtractor 8 and feedback circuit 9. That is to say, the noise shaping operation of that loop will be equivalent to that of a conventional double-integration delta-sigma quantizer such as is constituted by the sub-loop 106 in the prior art example of FIG. 14.

Considering the input signal applied to the local quantizer 6, the value of that signal is equal to the difference between the feedback quantity $\beta$ from the feedback circuit 9 and the quantization error Vq1 that is produced from the main loop. Due to the operation of the amplitude detection circuit 11, even if the value of the feedback quantity is 20,000 and the value of the input signal ($-Vq1$) supplied to the sub-loop is 12,000, then as shown in the appended Table 4, the output value from the local quantizer 1 will be $+2$, and the input value P that is supplied to the local quantizer 6 will be:

$$P = 12{,}000 - 11{,}264 \times 2 + 20{,}000 = 9472 \quad (8)$$

Thus, the value P will always be smaller than the feedback quantity $\beta$, and will always be held below the limit value (11264) of the input signal of the local quantizer 6. With this embodiment of the present invention, as for the prior art example of FIG. 14, the quantization error Vq2 that is produced by the local quantizer 6 is expressed as:

$$Q2 = -Vq1 + (1-z^{-1})^2 \cdot Vq2 \quad (9)$$

Hence, the value of the output signal Y from the adder 12 is expressed by the following equation (10), so that third-order noise shaping operation is achieved.

$$\begin{aligned} Y &= Q1 + (1-z^{-1}) \cdot Q2 \\ &= X + (1-z^{-1})^3 \cdot Vq2 \end{aligned} \quad (10)$$

The output signal from the local quantizer 1, in that case, can take 7 possible values, ranging from $-3$ to $+3$, while the output signal from the local quantizer 6 can take the two values $+0.5$ or $-0.5$, and the finally obtained output signal Y can take 9 values in the range $-4$ to $+4$. Thus, the same noise shaping operation is achieved as for the prior art example of FIG. 14.

Considering the internal signal transmission path, the manner in which the output value from the feedback circuit 9 is determined will be clear from FIG. 3, and the only question is with regard to the sign of the output signal from the subtractor 2. However even if the respective signs of the output values from the feedback circuit 9 and the subtractor 2 are mutually different, the signal transmission path will be: amplitude detection circuit 11→control circuit 5→subtractor 2→adder 7→subtractor 8 (and to local quantizer 6).

Figure 14:
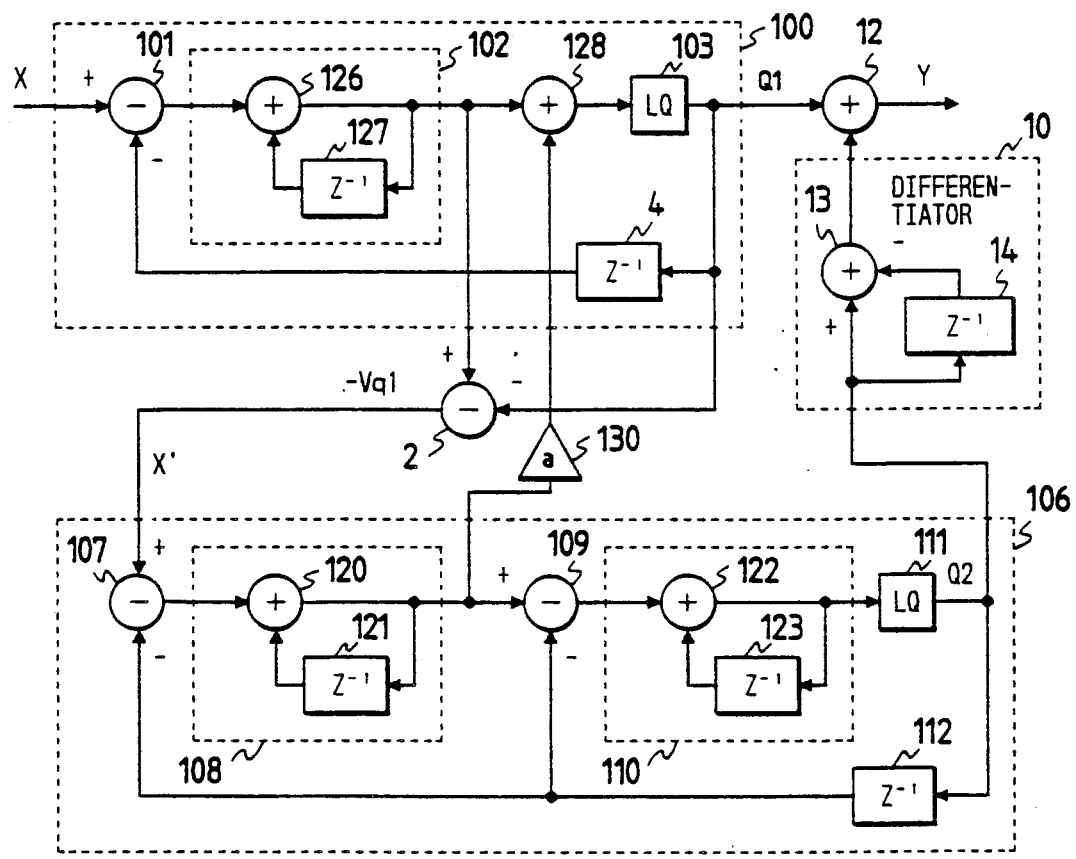
FIG. 14 is a block diagram of a prior art noise shaping requantizing circuit.

Thus, this signal transmission path is very short, by comparison with the prior art example of FIG. 14, so that there will be less of a time delay along that path, by comparison with the prior art example of FIG. 14. Furthermore in the case of the feedback applied to the main loop, that is applied in a direction such as to cause a reduction in the value of the input signal of the local quantizer 6, so that this also has the effect of applying feedback to the sub-loop as a whole. This feedback applied to the sub-loop enables a high degree of freedom in designing the feedback circuit 9. For example, even if the feedback circuit 9 has a third-order or higher-order characteristic, stable operation of the circuit can be ensured. As a specific example, the relationship between input and output values of the local quantizer 6 can be as shown in the appended Table 5, while the feedback circuit 9 can have a high-order transfer function H(z) that is expressed by the following equation (11):

$$H(z) = \frac{-2z^{-1} + 2.5z^{-2} - z^{-3}}{1 - z^{-1} + 0.5z^{-2}} \quad (11)$$

Figure 4:
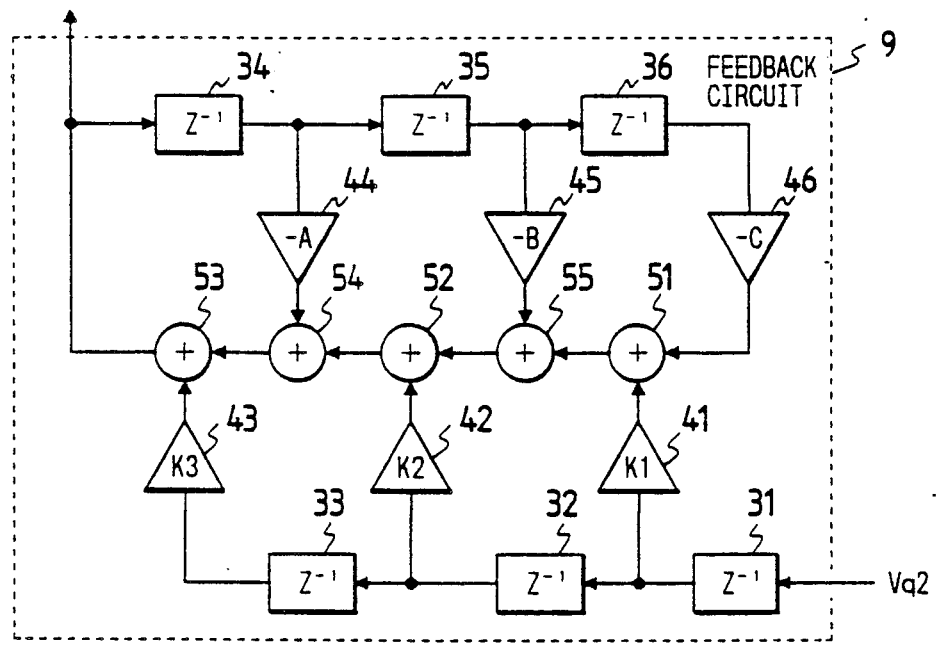

A specific configuration for the feedback circuit 9 to provide a transfer function of the form expressed by equation (11) is shown in FIG. 4. Here, 31 to 34 denote respective delay elements, 41 to 46 denote respective multipliers which execute multiplier by respective factors K1, K2, K3 and $-A$, $-B$, $-C$. 51 to 55 are respective adders. If the respective values of the factors K1 to K3 and $-A$ to $-C$ are set as $-2$, 2.5, $-1$, 0.5 and 0, then the feedback circuit 9 will provide a transfer function that is expressed by equation (11).

By using such a transfer function for the feedback circuit 9, fourth-order noise shaping is achieved in the low-frequency range. By using the feedback circuit of FIG. 4 for the feedback circuit 9 in the embodiment of FIG. 1, assuming that 32-times oversampling is used, then a dynamic range of approximately 118 dB can be achieved.

Figure 5:
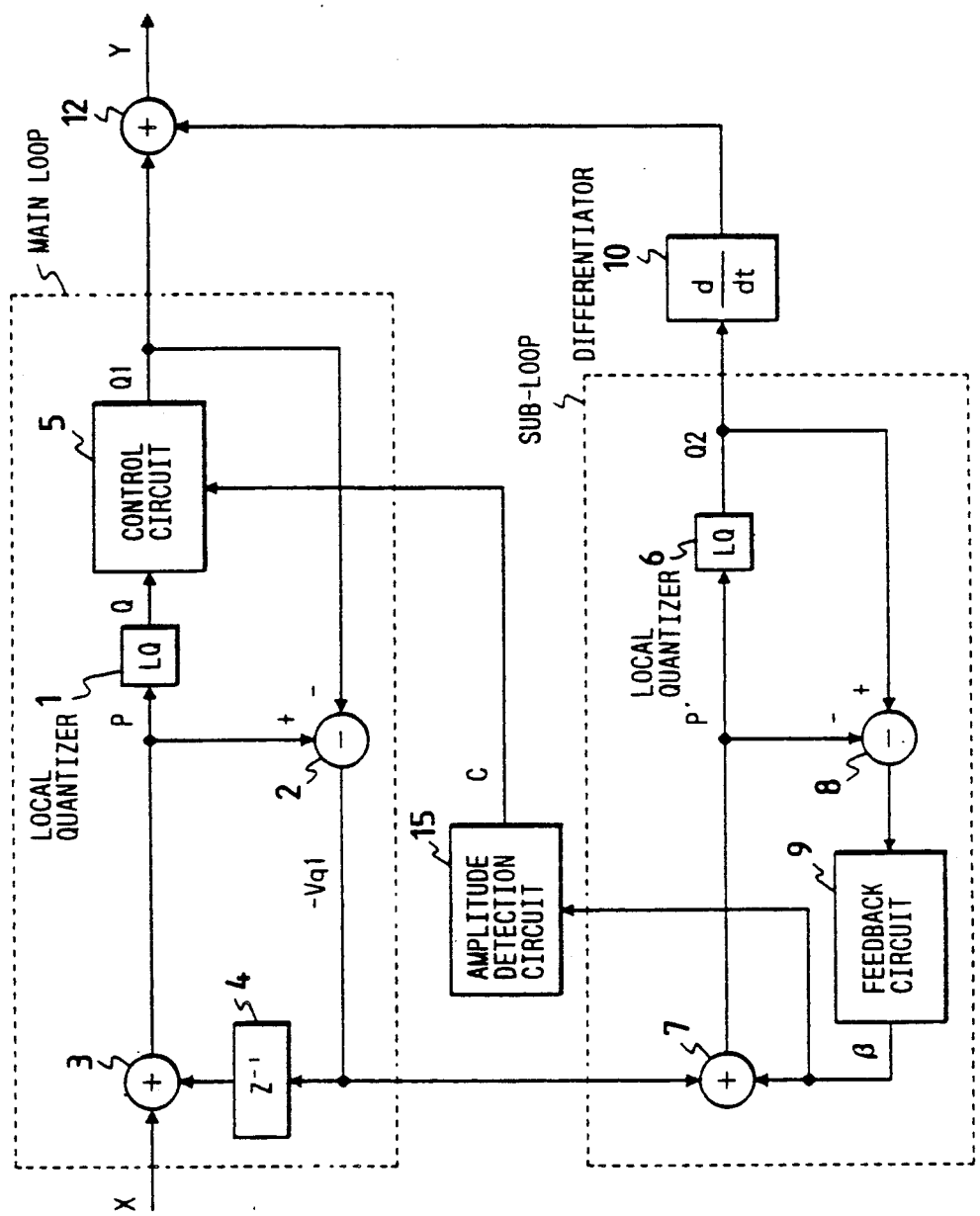
FIG. 5 is a block diagram of a second embodiment of a noise shaping requantizing circuit according to the present invention.

FIG. 5 shows another embodiment of a noise shaping requantizing circuit. The operation of this embodiment is similar to that of the first embodiment. Components in FIG. 1 corresponding to components in FIG. 1 are designated by identical reference numerals, and further description of these will be omitted. This embodiment differs from that of FIG. 1 in that amplitude detection circuit 15 is different from the amplitude detection circuit 11 in FIG. 1. In the case of FIG. 1, the amplitude detection circuit 11 receives two input signals, i.e. the output signal from the subtractor 2 and the feedback quantity $\beta$ from the feedback circuit 9. However in the embodiment of FIG. 5, the amplitude detection circuit 15 receives only the output signal from the feedback circuit 9. The input/output value relationships of the amplitude detection circuit 15 are shown in the appended Table 6. The operation of this embodiment is similar to that of the embodiment of FIG. 1. Since it is arranged that the output value produced from the subtractor 2 always tends to be cancelled by the feedback quantity $\beta$ from the feedback circuit 9, stable operation of the sub-loop is ensured, and effective noise shaping can be achieved with a low degree of quantization resolution of the final output signal Y.

FIG. 6A shows a third embodiment of a noise shaping requantizing circuit according to the present invention. The operation of this embodiment is similar to that of the first embodiment. Components in FIG. 1 corresponding to components in FIG. 1 are designated by identical reference numerals, and further description of these will be omitted. The appended Table 2 shows the relationships between input and output signal values of the local quantizer 6. Numeral 11 denotes an amplitude detection circuit, which receives as input the feedback quantity from the feedback circuit 9, and produces an output value C which is predetermined in accordance with the value of the feedback quantity $\beta$. The relationship between the value of and that of the output signal C for the amplitude detection circuit 11 of this embodiment is as shown in the appended Table 7.

The operation of this embodiment is as follows. In the main loop, the output signal Q1 from the local quantizer 1 is expressed by the aforementioned equation (7), as for the embodiment of FIG. 1. However in the case of the sub-loop, as described hereinabove, the output signal from the local quantizer 6 has only two values, i.e. +0.5 or −0.5, while due to the form of the transfer function of the feedback circuit 9, the feedback quantity has a maximum value that is three times the maximum value of the quantization error generated by the local quantizer 6. During normal operation, the quantization error produced by the local quantizer 6 is 0.5 or less, so that the maximum value of the feedback quantity $\beta$ will be 1.5.

The input signal to the local quantizer 6 is the difference between the feedback quantity $\beta$ and the quantization error Vq1 produced by the main loop. Assuming that the feedback quantity $\beta$ is in the range 0 to 11264, then 5632 will be added to the input signal supplied to the local quantizer 1, and the quantization error Vq1 will be in the range 0 to 11264. Hence, the value of the input signal P of the local quantizer 6 will be in the range −11264 to 11264. That is to say, normalizing these values with respect to 11264, this is a range of values for signal P of from −1.0 to 1.0. The feedback quantity and the quantization error Vq1 can be considered to be random values, and in that case, the average value of each of these is 5632, while the average difference between them (designated as Pave) will be approximately zero.

The appended Table 8 shows other relationships between the feedback quantity $\beta$, output signal C from the amplitude detection circuit 11, the quantization error −Vq1, and the average difference Pave. All of the values in Table 8 have been normalized with respect to 11264.

It can thus be understood that the average input signal value supplied to the local quantizer 6 is held within a (normalized) range of −0.25 to +0.25, so distortion resulting from the operation of the sub-loop can be minimized. Thus, as for the embodiment of FIG. 1, the aforementioned equation (9) holds true for the relationship between the output signal Q2 from the local quantizer 6 and Vq1, while the aforementioned equation (10) holds true for the finally obtained output signal Y. Third-order noise shaping is achieved in this example. The output signal from the local quantizer 1 can take 7 values, from −3 to +3, while the output signal from the local quantizer 6 can take two values, i.e. +0.5 and −0.5. Hence, the final output signal Y can take 9 values, from −4 to +4, and similar noise shaping operation to that of the prior art example of FIG. 14 can be achieved.

Figure 6B:
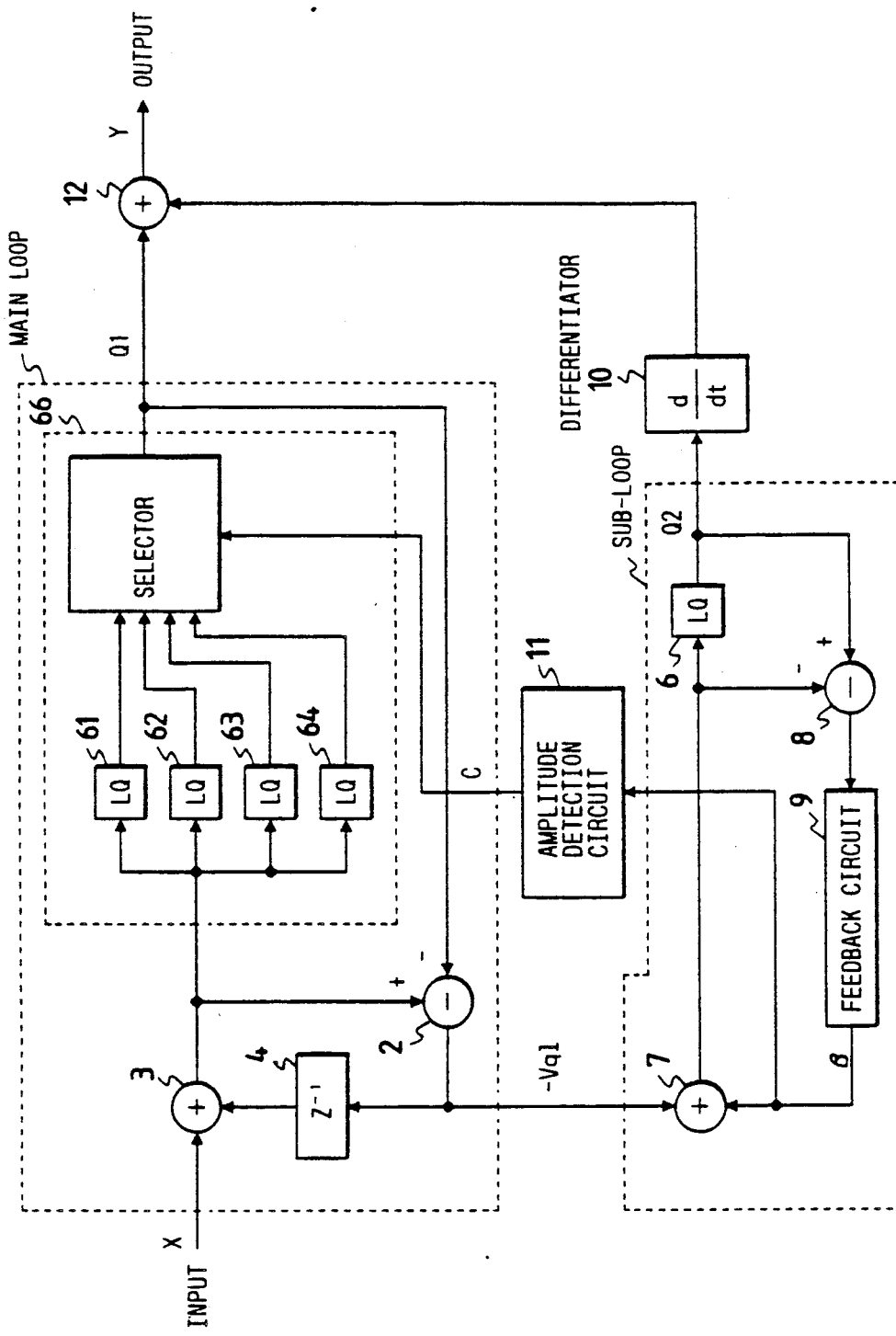
FIG. 6B is a block diagram of a circuit which is a variation of the third embodiment.

Instead of adding one of a set of predetermined values (i.e. of the signal C) to the input signal of the local quantizer 1, as with the embodiment of FIG. 6A, it is possible to vary the type of quantization that is executed by that local quantizer in accordance with that signal C, produced by the amplitude detection circuit 11. FIG. 6B shows such an alternative arrangement in which, instead of the combination of the adder 25 and local quantizer 1 of FIG. 6A, a local quantization circuit 66 is formed of a plurality of local quantizers 61 to 64 which have respectively different sets of quantization threshold levels, and whose output signals are selected by a selector 65 under the control of the output signal C from the amplitude detection circuit 11.

The appended Table 9 expresses the relationship between the output signal C from the amplitude detection circuit 11 and the feedback quantity $\beta$ in this case. The appended Table 10 shows the relationships between the quantization levels of the four local quantizers 61 to 64 in FIG. 6B, e.g. with the outputs from quantizers 61, 62, 63 and 64 being respectively selected when the value of signal C is −2, −1, 0 and +1, respectively.

It can be understood that similar effects can be obtained to those of the embodiment of FIG. 6A. All of the values in Tables 9 and 10 have been normalized with respect to 11264.

It can also be understood the same effect as that of FIG. 6B would be obtained by using a single local quantizer in the circuit 66, with respective sets of quantization threshold values for that quantizer being generated within circuit 66 and with one of these sets being selected in accordance with the value of the signal C from the amplitude detection circuit.

Considering the signal transmission path of the feedback loop of the feedback circuit 9 in FIG. 6A, feedback is applied along the path:

feedback circuit 9—amplitude detection circuit 11—adder 25—local quantizer 1—subtractor 2—adder 7—subtractor 8 (and to the local quantizer 6).

Thus, the feedback transmission path is very short. Furthermore, it is possible for example to use a feedback circuit 9 having a third-order or higher order characteristic, while achieving stable operation of the circuit. In addition, third-order noise shaping can be implemented, by using a local quantizer 6 having input and output signal value relationships in accordance with the aforementioned Table 5, and using a feedback circuit 9 having a transfer function that is in accordance with the aforementioned equation (11). Such high-order noise shaping is attainable together with stable circuit operation.

Figure 7:
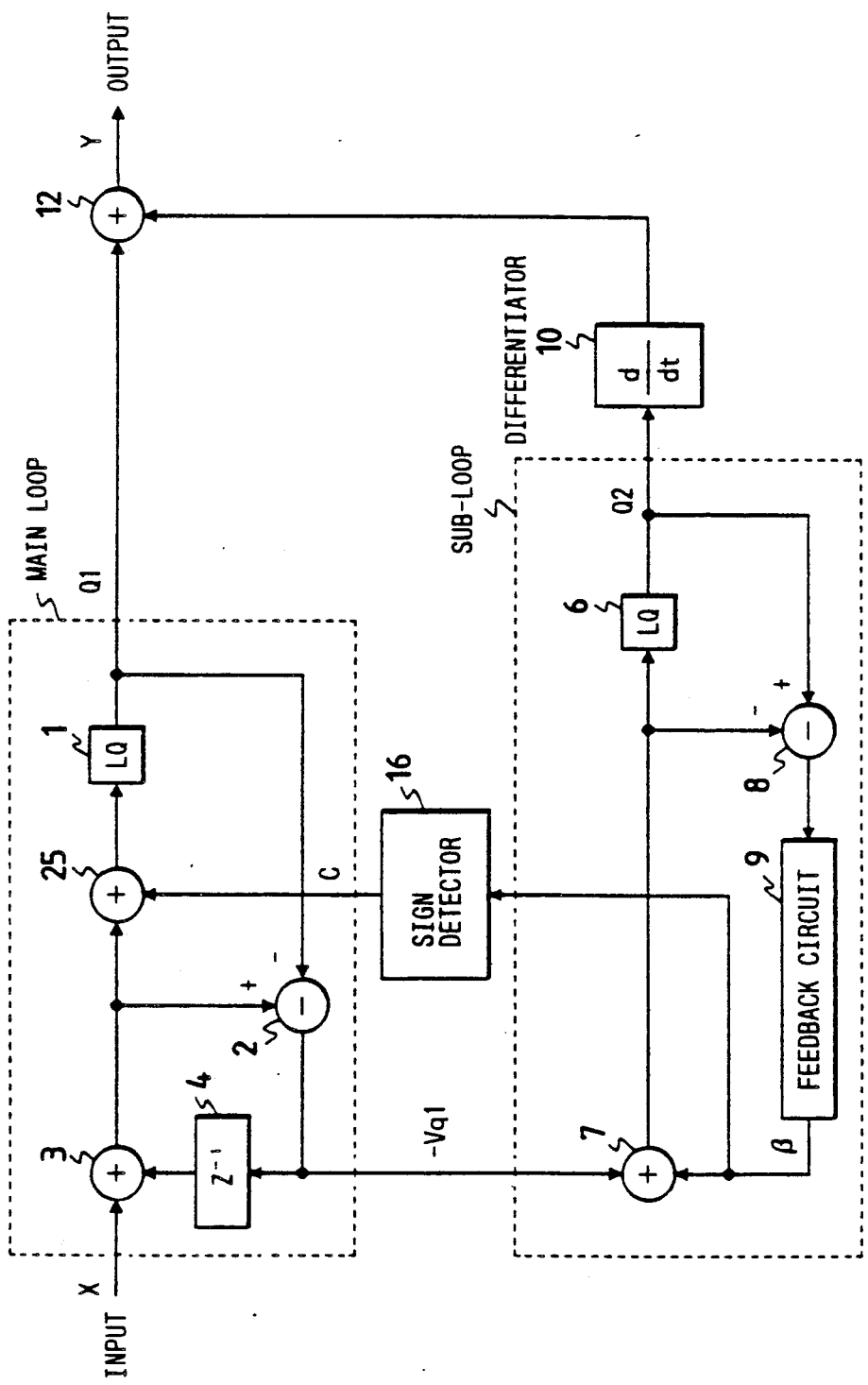
FIG. 7 is a block diagram of a fourth embodiment of a noise shaping requantizing circuit according to the present invention.

FIG. 7 shows a fourth embodiment of a noise shaping requantizing circuit according to the present invention. Components in FIG. 7 having identical functions to components in FIG. 1 are designated by corresponding reference numerals, and detailed description of these will be omitted. The input and output signal value relationships of the local quantizer 6 are in accordance with the aforementioned Table 2. A sign detection circuit 16 receives the feedback quantity from the feedback circuit 9, and outputs one of two predetermined values in accordance with the polarity of $\beta$. In this embodiment, these two values each have a magnitude that is one half of the quantization step size of the local quantizer 1, i.e. 11264/2=5632, so that the two predetermined values +5632 and −5632. In practice, the amplitude detection circuit 11 is supplied with the most significant bit (hereinafter referred to as MSB) of the feedback quantity from the feedback circuit 9. Thus, if the input supplied to the amplitude detection circuit 11 is 0, then that circuit outputs the value +5632, while if the input is 1, then −5632 is outputted.

The operation of the circuit of FIG. 7 is as follows. The output signal Q1 from the local quantizer 1 in the main loop is identical to the signal Q1 in the embodiment of FIG. 1, with its input and output signal relationships being in accordance with the aforementioned equation (7). In addition, the local quantizer 6 produces one of two output values +0.5 or −0.5, as for the preceding embodiments. The feedback quantity β produced from the feedback circuit 9 has a maximum value that is three times the maximum value of the quantization error of the local quantizer 6, as will be clear from the transfer function of the feedback circuit 9, and since the amount of quantization error that is produced by the local quantizer 6 during normal operation will be 0.5 or less, the maximum value of the feedback quantity from the feedback circuit 9 will be 1.5.

Considering the input signal that is applied to the local quantizer 6, the value of that signal is the sum of the feedback quantity β from the feedback circuit 9 and the quantization error Vq1 generated by the main loop, but with the sign of Vq1 having been inverted. The respective cases in which the feedback quantity β is positive and negative will be considered, as follows.

When $\beta \geq 0$:

In this case, since 5632 is added to the input signal of the local quantizer 1, this is equivalent, in effect to changing the operation of the local quantizer 1 from "rounding-off to the nearest whole number", i.e. producing an output value corresponding to the nearest local quantizer 1 from "rounding-off to the nearest whole number", i.e. with the output value corresponding to the nearest threshold level to the input value, to truncation, i.e. with the output value corresponding to the next-lowest threshold value to the input value. Thus a negative quantization error will be generated by the local quantizer 1, so that the output signal (−Vq1) produced from the subtractor 2 will be positive.

In this way, the respective signs of the input signals (−Vq1) and applied to the adder 7 will always be mutually different. The average of the absolute value of Vq1 is 0.5, and hence the input signal value supplied to the local quantizer 6 will be within the range of −1.0 to +1.0, so that generation of distortion is reduced. Thus with this embodiment, as for the embodiment of FIG. 1, the relationship between the output signal Q2 from the local quantizer 6 and Vq1 will be in accordance with the aforementioned equation (9), while the relationship between the final output signal Y, the output signal from the adder 12, and the input signal X will be in accordance with the aforementioned equation (10). Hence, third-order noise shaping operation is achieved, with the output signal Q1 from the local quantizer 1 having 7 possible values, in the range from −3 to +3, and since the output signal from the local quantizer 6 can have only the two values +0.5 and −0.5, the final output signal Y can take 9 values, from −4 to +4. Thus this embodiment also provides similar noise shaping operation to that of the prior art example of FIG. 14.

Considering the feedback signal transmission path, in the same way as for the embodiment of FIG. 6, that path is extremely short by comparison with the prior art example of FIG. 14. Moreover even if the feedback circuit 9 has a third-order or higher-order characteristic, stable operation is assured. Thus for example the local quantizer 6 can have input and output signal value relationships in accordance with the aforementioned Table 5, and the transfer function of the feedback circuit 9 can be a high-order transfer function in accordance with the aforementioned equation (11).

Figure 8:
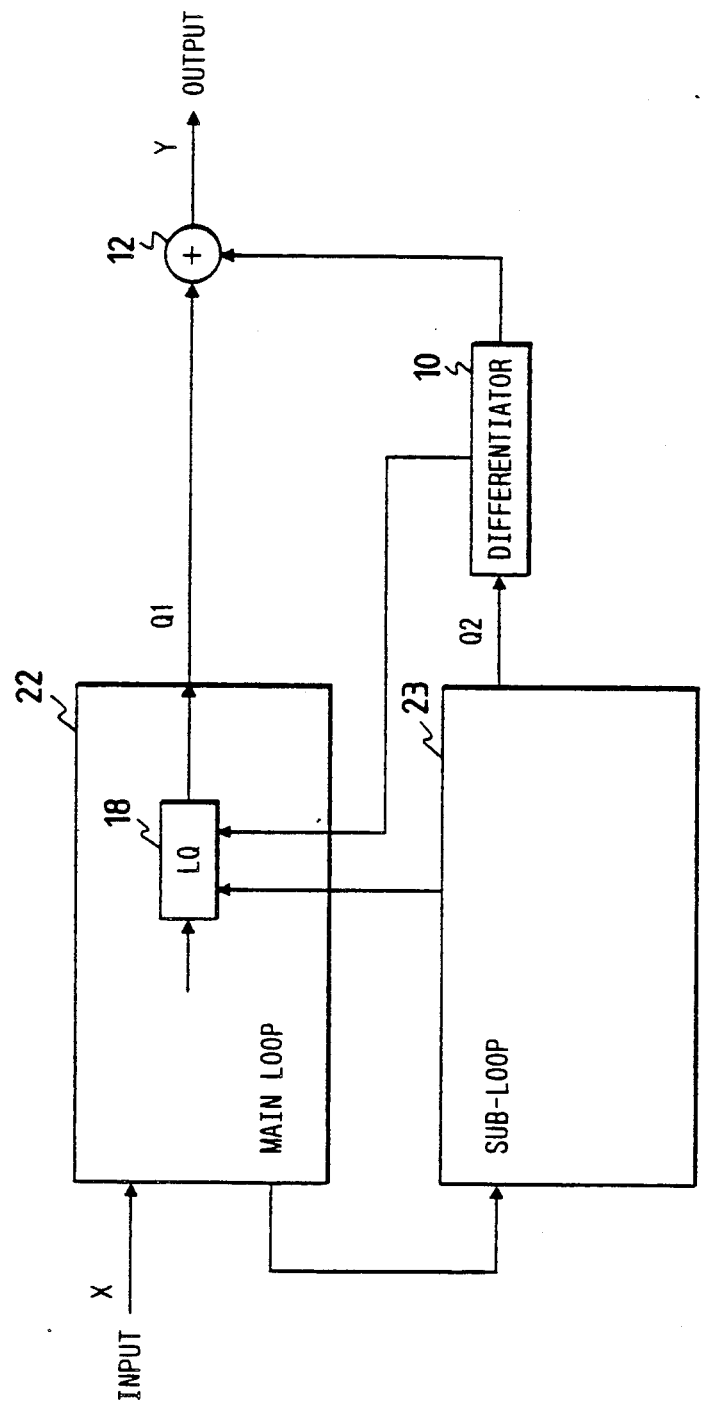
FIG. 8 is a conceptual block diagram of a fifth embodiment of a noise shaping requantizing circuit according to the present invention.
Figure 10:
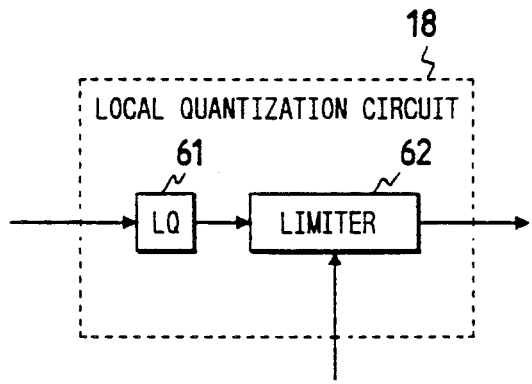
FIG. 10 is a block diagram showing a specific configuration for a local quantizer 18 in the embodiment of FIG. 8.

FIG. 8 is a conceptual diagram of a fifth embodiment of a noise shaping requantizing circuit according to the present invention. In FIG. 8, numeral 22 denotes a main loop, which functions as a delta-sigma quantizer and which can for example be identical to the main loop 100 in the prior art example of FIG. 14, which is a single-integration delta-sigma quantizer providing a first-order noise shaping characteristic. Numeral 23 denotes a sub-loop, which can for example be identical to the sub-loop 106 in the prior art example of FIG. 14. An local quantization circuit 18 executes quantization of the input digital signal X, with limiting of the upper and lower limits of the quantization result being controlled by an input control signal supplied from the differentiator 10. The internal configuration of the local quantization circuit 18 is as shown in FIG. 10, i.e. formed of a local quantizer 61 and a limiter 62, which is controlled by the aforementioned input control signal. The quantization can for example be executed in accordance with the appended Table 11. As for the case of the prior art example of FIG. 14, it will be assumed that an input signal level of 0 dB corresponds to a signal value of 32,768.

The output signal value from the sub-loop 23 will be either 0.5 or −0.5, so that the output value from the differentiator 10 will be −1, 0, or +1. The local quantization circuit 18 varies the upper and lower limits of the output signal value produced therefrom, in accordance with the aforementioned control input signal, which indicates a specific condition of the differentiator 10. It will be assumed here that the specific condition of the differentiator 10 simply consists of the output signal value that is currently being produced from the differentiator 10, i.e. which will be one of the three values −1, 0 or +1 as described above. That is to say, in this case the output signal from the differentiator 10 is supplied both to the adder 12 and also, as a control signal, to the local quantization circuit 18. The relationships between the values of that control signal and the upper and lower limits of the output signal values from the local quantization circuit 18 are shown in the appended Table 12. As shown, when the value of that control input signal is +1, the upper limit of the output signal from the local quantization circuit 18 is set as +2, while when the control input signal value is −1, the lower limit of the output signal from the local quantization circuit 18 is set as −2.

Considering the output signal produced from the differentiator 10, since the input signal value applied to the differentiator 10 can only take the two levels −0.5 and +0.5, even if it is assumed that the output value from the differentiator 10 is +1, it is certain that the next output value from the differentiator 10 will be 0 or less. That is to say, the fact that a +1 output value is currently being produced from the differentiator 10 signifies that the input signal value applied to the differentiator 10 has been incremented (since the preceding signal period, where "signal period" signifies the sampling period of the input signal X) by +1. Since the input signal to the differentiator 10 only can take the two values −0.5 and +0.5, it is necessary that an input sequence to the differentiator 10 of −0.5 followed by +0.5 has occurred. Hence it is certain that, irrespective of what the next input value to the differentiator 10 will be, the next output value from that circuit will be either 0 or less than 0. Thus, in one out of every two successive signal periods, the local quantization circuit 18 will produce an output signal value of +3 or higher, or of −3 or lower.

With the configuration shown in FIG. 8, even if the level of the input signal X is 0 dB or higher, the quantization error Vq1 generated by the main loop will increase only monotonically, so that normal operation can be achieved even in the case of a very large-amplitude input signal being applied, while the level of the final output signal Y is held to a total of 7 possible values, from −3 to +3. Thus, the degree of quantization resolution of this embodiment is not increased by comparison with the prior art example of FIG. 14.

Figure 9:
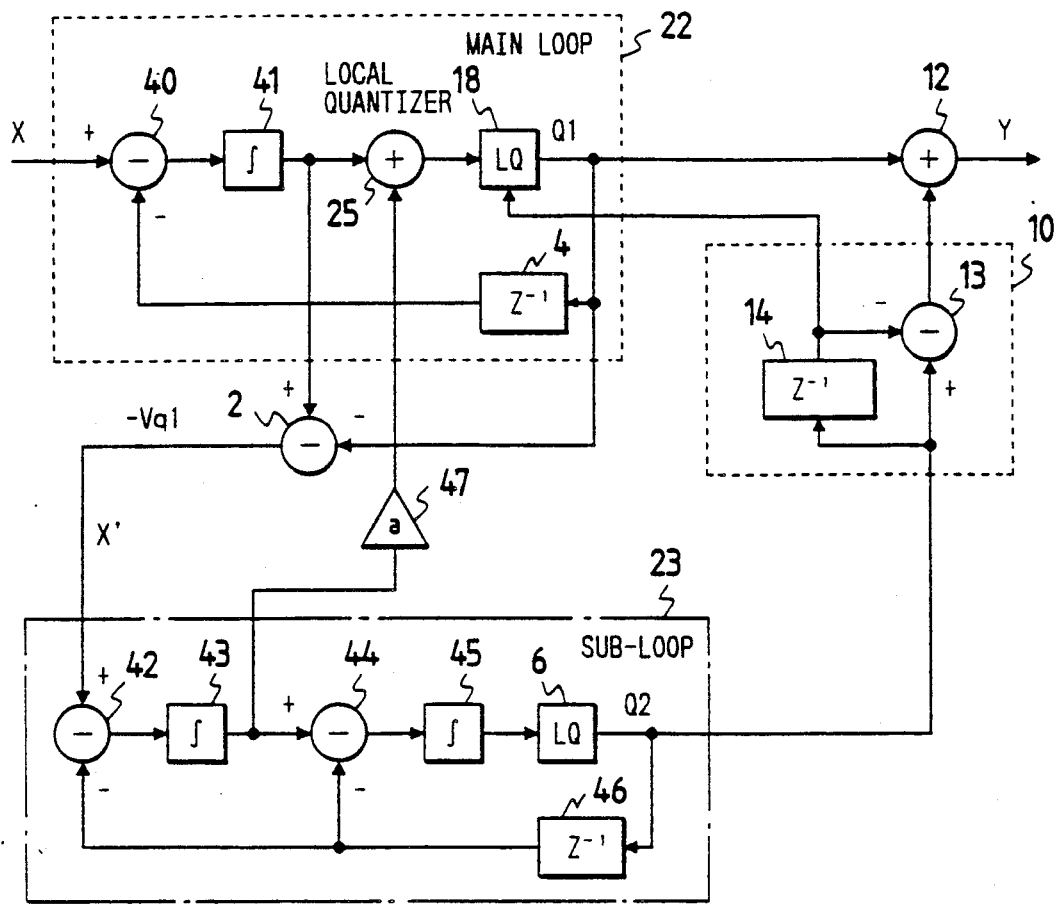
FIG. 9 shows a specific configuration for the embodiment of FIG. 8.

FIG. 9 shows a sixth embodiment of a noise shaping requantizing circuit according to the present invention, which is actually an example of a specific configuration for the noise shaping requantizing circuit embodiment of FIG. 8. Components in FIG. 9 having identical functions to components in the embodiments of FIGS. 1 to 8 are designated by corresponding reference numerals, and detailed description of these will be omitted. In FIG. 9, the local quantizer circuit 18 of the main loop 22 has the internal configuration shown in FIG. 10, i.e. being formed of a local quantizer 61 whose output signal is transferred through a limiter 62. The relationships between input and output signal values of the local quantizer 61 are as shown in the appended Table 13. The limiter 62 controls the upper and lower limits of the output signal from the local quantizer 61 in accordance with a control signal that is derived from the differentiator 10. In this example, the control signal is the output produced from the delay element 14 of the differentiator 10, and control is executed such that the upper and lower limits of the output signal from the local quantizer circuit 18 are set as follows:

When output value from delay element 14= −0.5, upper limit= +3, lower limit= −2

When output value from delay element 14= −0.5, upper limit= +2, lower limit= −3

Cases in which the level of the input signal X of the noise shaping requantizing circuit is 0 dB, e.g. when that signal is at a DC value of 32,768, will now be considered, as follows:

When the output value from the delay element 14= −0.5

If the output signal value from the integrator 43 of the sub-loop 23 is positive, then the local quantization circuit 18 will produce an output value of 3. However the limiter 62 will limit that to a value of 2. Thus, the quantization error Vq1 will gradually go to a smaller value. Since (−Vq1) is inputted to the sub-loop 21, the value of the output signal from the integrator 43 will gradually increase, and hence the output value from the integrator 45 will gradually increase. When that output value reaches a positive level, the output signal value from the local quantizer 6 will be 0.5. Thus, the output signal from the delay element 14 will become +0.5 in the next signal period, while the output signal from the local quantization circuit 18 will reach its upper limit value of +3. The sub-loop 23 will thus operate normally, without introducing distortion, even though the level of the input signal X is 0 dB. Furthermore, if the output sign value from the integrator 43 is negative, then the output value from the local quantization circuit 18 will be equal to 2, so that no problem will arise.

When the output value from the delay element 14= +0.5

Basically, the output value produced from the local quantization circuit 18 in this case should be +3 initially, then will become +2. Since the same limitations are placed on the output signal values as for the case described above, it will be clear that completely normal operation will be obtained.

Thus, with the configuration of FIG. 9, satisfactory operation is possible with a maximum level of 0 dB of the input signal X, without the need to increase the quantization resolution of the output signal Y.

Figure 11:
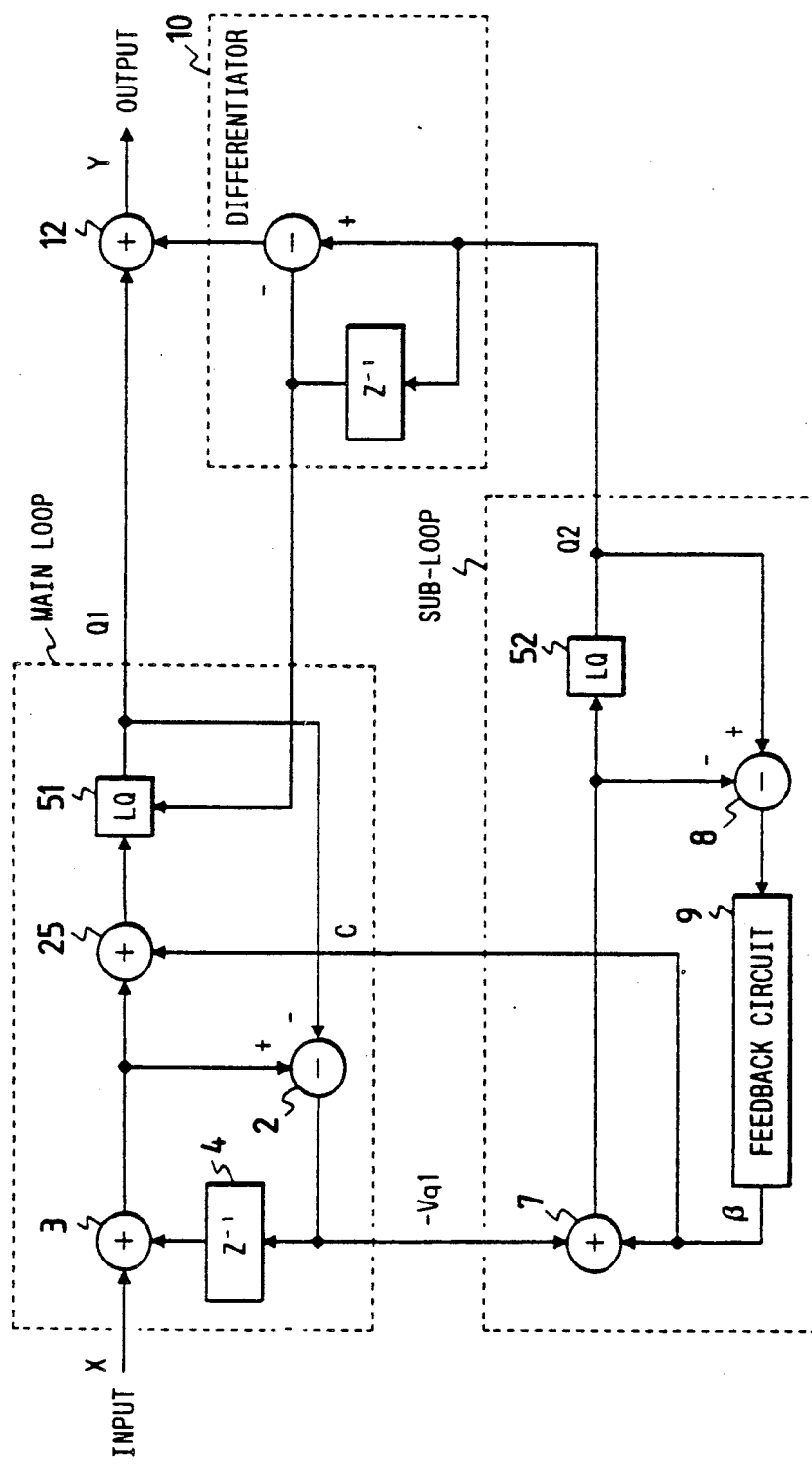
FIG. 11 is a block diagram of a sixth embodiment of a noise shaping requantizing circuit according to the present invention.

FIG. 11 is a block diagram of a seventh embodiment of a noise shaping requantizing circuit according to the present invention. Since the functions of this embodiment are similar to those of the embodiments of FIGS. 1 to 10, components in FIG. 9 corresponding to components in the embodiments of FIGS. 1 to 8 are designated by identical reference numerals, and detailed description of these will be omitted. In this embodiment, a local quantizer circuit 51 is identical to the local quantizer circuit 18 of the embodiments of FIGS. 9 and 11, i.e. having the configuration shown in FIG. 10. However the local quantizer 61 within the local quantizer circuit 51, in this case, executes quantization in accordance with the appended Table 14. An input signal level of 0 dB corresponds to a value of 33,792, and the output signal values are normalized with respect to 11,264. The limiter 62 limits the output values that can be produced from the noise shaping requantizing circuit, in accordance with the output signal value from the delay element 14, as follows:

When output value from delay element 14= +1.0, upper limit= +5, lower limit= −3

When output value from delay element 14=0, upper limit= +4, lower limit= −4

When output value from delay element 14= −1, upper limit= +3, lower limit= −5

The local quantizer 52 executes quantization in accordance with the appended Table 15.

The transfer function H(z) of the feedback circuit 9 is given by the aforementioned equantion (11).

The operation of the noise shaping requantizing circuit of FIG. 11 is as follows. Designating the input signal to the local quantizer 51 as P, and the output signal from that local quantizer circuit as Q1, the relationship between these is expressed by the following:

$$Q1 = [(P+5632)/(11,264]\qquad(12)$$

In the above, "[]" indicate Guassian symbols.

The quantization error Vq1 is derived from the output signal C of the adder 3 and the feedback quantity $\beta$ from the feedback circuit 9, by the following equation:

$$Vq1 = [(C+\beta+5632)/(11,264] \cdot 11,264 - C \qquad (13)$$

The input signal P' to the local quantizer 52 is the difference between the feedback quantity $\beta$ and the quantization error Vq1, as expressed by the following:

$$P' = \beta - Vq1 = +C - [(C+\beta+5632)/(11,264] \cdot 11,264 \qquad (14)$$

The equation (14) shows that the value P' will always be within the range −5632 to +5632, so that the sub-loop containing the local quantizer 52 will not oscillate, and will operate in a stable condition. Thus, designating the quantization error produced by the local quantizer 52 as Vq2, the following equation (15) is obtained:

$$Q2 = -Vq1 + \frac{(1-z^{-1})^3}{1-z^{-1}+0.5z^{-2}} \cdot Vq2 \qquad (15)$$

The output signal Y from the adder 12 is given by the following equation (16). It can be understood that this provides a fourth-order noise shaping characteristic in the low frequency range. If the circuit is operated with 32-times oversampling, a dynamic range of approximately 119 dB is obtained.

$$Y = Q1 + (1 - z^{-1}) \cdot Q2 = X + \frac{(1 - z^{-1})^4}{1 - z^{-1} + 0.5z^{-2}} \cdot Vq2 \quad (16)$$

Moreover, due to the fact that the upper and lower limit values of the output signal from the local quantizer 51 are expanded or contracted in accordance with the condition of and output signal from the differentiator 10, the feedback circuit 9 can provide effective feedback operation even if the level of the input signal X is 0 dB. Thus, even with such a high level of input signal, the sub-loop will operate stably, without oscillation.

In each of the above embodiments (other than that of FIG. 11) it is assumed that the local quantizer of the main loop produces an output signal that can take 5 values, from −3 to +3. However the embodiments are of course not limited to such values. Moreover although the embodiments have been described for the case of the main loop being a first-order delta-sigma quantizer, the invention is not limited to this, and it would be possible to use a higher-order local quantizer. In such a case, it is only necessary to suitably change the output values produced from the feedback circuit 9 within the sub-loop, and (in the case of the embodiments of FIGS. 9 and 11) the limit control operation that is executed in accordance with the condition of the differentiator that is connected to the sub-loop.

Furthermore, it may not be necessary to input all of the bits of the output signal from the feedback circuit 9 to the amplitude detection circuit 11, i.e. only some of the high-order bits, or the MSB, can be inputted to the amplitude detection circuit 11.

Moreover, although the transfer function of the feedback circuit 9 has been described as being expressed by equations (6) or (11), and the local quantizer 6 has been described as producing two possible output values, or three possible output values, the invention is not limited to these. For example, fourth-order noise shaping can be achieved by using a transfer function for the feedback circuit 9 that is expressed by any one of the following equations (17) to (24):

$$H(z) = \frac{-2.0625z^{-1} + 2.5z^{-2} - z^{-3}}{1 - 0.9375z^{-1} + 0.5z^{-2}} \quad (17)$$

$$H(z) = \frac{-2.125z^{-1} + 2.5z^{-2} - z^{-3}}{1 - 0.875z^{-1} + 0.5z^{-2}} \quad (18)$$

$$H(z) = \frac{-2z^{-1} + 2.5z^{-2} - 0.875z^{-3}}{1 - z^{-1} + 0.5z^{-2} - 0.125z^{-3}} \quad (19)$$

$$H(z) = \frac{-2.25z^{-1} + 2.5625z^{-2} - z^{-3}}{1 - 0.75z^{-1} + 0.4375z^{-2}} \quad (20)$$

$$H(z) = \frac{-2.125z^{-1} + 2.5z^{-2} - 1.0625z^{-3}}{1 - 0.875z^{-1} + 0.5z^{-2} + 0.0625z^{-3}} \quad (21)$$

$$H(z) = \frac{-2.375z^{-1} + 2.625z^{-2} - z^{-3}}{1 - 0.625z^{-1} + 0.375z^{-2}} \quad (22)$$

$$H(z) = \frac{-2.25z^{-1} + 2.625z^{-2} - 1.125z^{-3}}{1 - 0.75z^{-1} + 0.375z^{-2} + 0.125z^{-3}} \quad (23)$$

$$H(z) = \frac{-2z^{-1} + 2.5625z^{-2} - 1.0625z^{-3}}{1 - z^{-1} + 0.4375z^{-2} + 0.0625z^{-3}} \quad (24)$$

Figure 13:
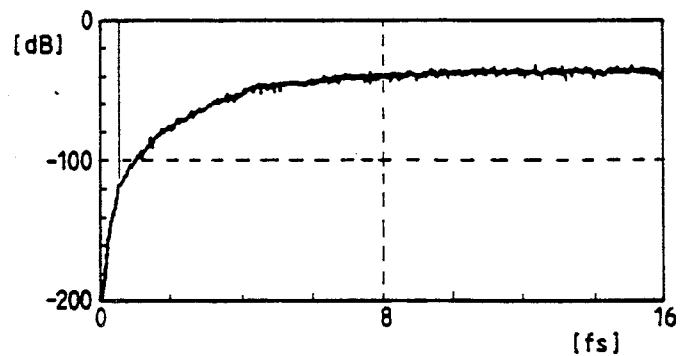
FIG. 13 shows the output spectrum from a noise shaping requantizing circuit according to the present invention.

With each of the above transfer functions, the denominator consists of sums or differences of terms of the form $(\frac{1}{2})^n$, so that all of the multipliers 41 to 46 can each be implemented simply by a bit shifter and an adder/subtractor. Thus, the scale of the hardware is not significantly increased. If a noise shaping requantizing circuit according to the present invention executes 32-times oversampling operation, then the spectrum obtained for the case of a $\eta$ in input signal of 0 dB level, representing a sine wave, at $f_s/2$, will be as shown in FIG. 13.

The values for the respective multiplication coefficients A, B, C, K1, K2, K3 of the feedback circuit configuration shown in FIG. 4 and described hereinabove, for the cases in which the transfer function of the feedback circuit 9 is expressed by equations (17) to (24), respectively, are shown in the appended Table 16. Table 16 also shows the respective values of dynamic range that are obtained, for the case of 32-times oversampling being executed by the noise shaping requantizing circuit, and the value of maximum gain of the feedback circuit 9, for transfer functions in accordance with the equations (17) to (24).

Figure 12:
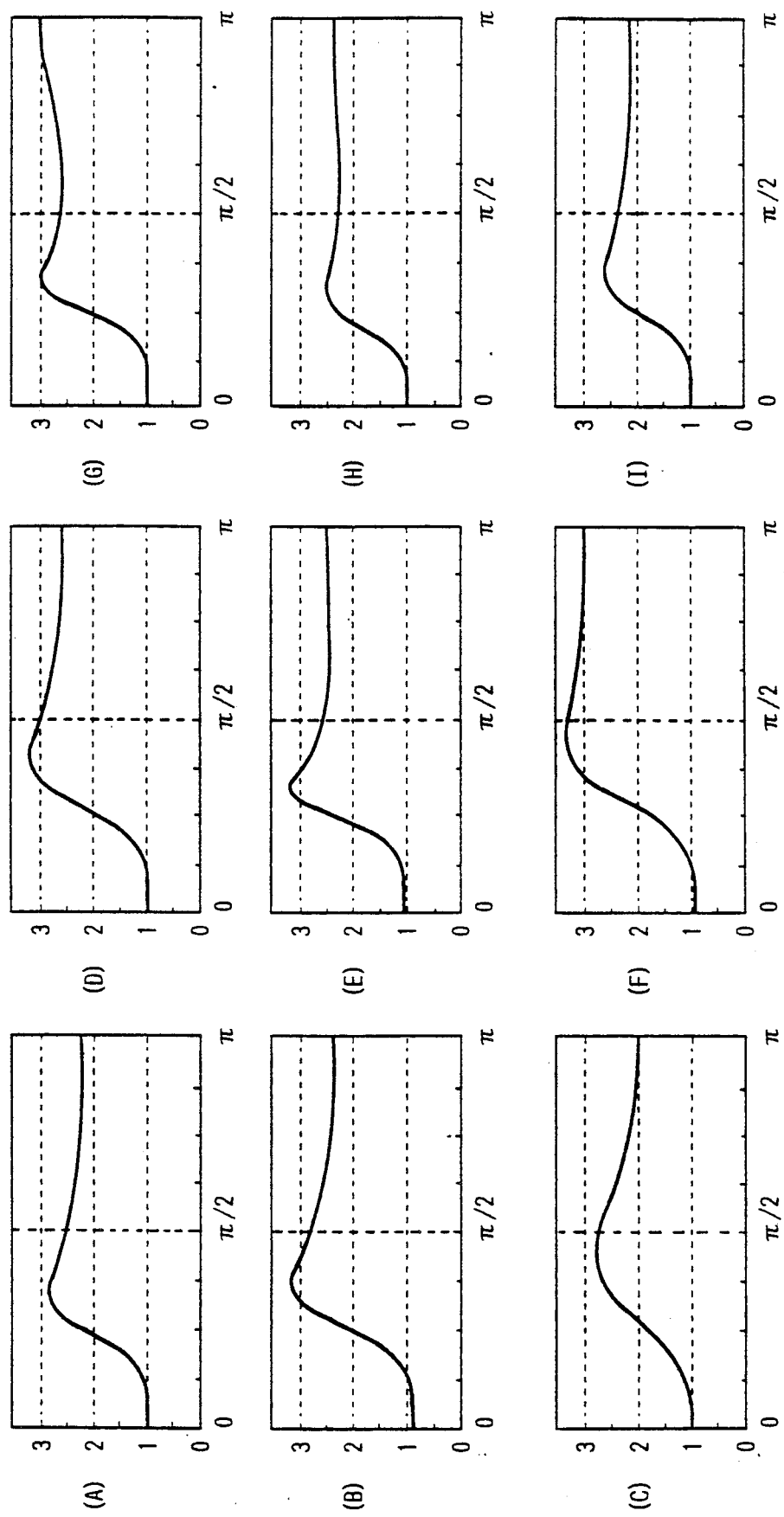
FIG. 12 shows gain/frequency characteristics for various transfer functions.

In FIG. 12, the graphs B to I respectively represent the frequency characteristics of the transfer functions H(z) obtained using the equations (17) to (24) and (11), respectively.

It can be understood from the above that the various embodiments of the present invention enable high-order noise shaping to be achieved, by a multi-stage type of delta-sigma quantization circuit formed of a main loop and a sub-loop, with excellent stability of operation even in the case of a large-amplitude input signal being applied, while enabling the quantization resolution of the sub-loop to be made lower (in relation to the high-order noise shaping executed by that loop) than has been possible in the prior art. The quantization resolution, i.e. number of values, of the finally obtained output signal can thereby be held low, in spite of the high-order noise shaping and wide dynamic range that can be achieved. Using only a small number of output values for that output signal provides various well-known advantages, such as simplicity of executing digital-/analog conversion of that output signal, and capability for executing that conversion with a high degree of linearity using a simple D/A converter circuit configuration.

TABLE 1

| INPUT | OUTPUT |
| --- | --- |
| 24579 OR MORE | +2 |
| 8191 ~ 24575 | +1 |
| −8192 ~ 8191 | 0 |
| −24576 ~ −8193 | −1 |
| −24577 OR LESS | −2 |

TABLE 2

| INPUT | OUTPUT |
| --- | --- |
| 0 OR MORE | +0.5 |
| −1 OR LESS | −0.5 |

TABLE 3

| INPUT | OUTPUT |
| --- | --- |
| 28160 ~ | +3 |
| 16896 ~ 28159 | +2 |
| 5632 ~ 16895 | +1 |
| −5632 ~ 5631 | 0 |
| −16896 ~ −5633 | −1 |

TABLE 3-continued

| INPUT | OUTPUT |
|---|---|
| −28160 ~ −16897 | −2 |
| ~ −28161 | −3 |

TABLE 4

| −Vql | FEEDBACK QUANTITY β | OUTPUT C |
|---|---|---|
| ≧0 | 16896 ~ | 010 = +2 |
|  | 5632 ~ 16895 | 001 = +1 |
|  | −5632 ~ 5631 | 000 = 0 |
| <0 | −16896 ~ −5633 | 111 = −1 |
|  | ~ −16987 | 101 = −2 |

TABLE 5

| INPUT | OUTPUT |
|---|---|
| 5632 ~ | +1 |
| −5632 ~ 5631 | 0 |
| ~ −5633 | −1 |

TABLE 6

| FEEDBACK QUANTITY β | OUTPUT C |
|---|---|
| 16896 ~ | 010 = +2 |
| 5632 ~ 16895 | .001 = +1 |
| −5632 ~ 5631 | 000 = 0 |
| −16896 ~ −5633 | 111 = −1 |
| ~ −16987 | 101 = −2 |

TABLE 7

| FEEDBACK QUANTITY β | OUTPUT C |
|---|---|
| +11264 OR HIGHER | +11264 |
| 0 ~ +11263 | +5632 |
| −11264 ~ −1 | −5632 |
| −11265 OR LESS | −11264 |

TABLE 8

| β | C | −Vql | $P_{AVE}$ |
|---|---|---|---|
| +1.0 | +1.0 | −1.5 ~ −0.5 | +0.25 |
| 0.0 ~ +1.0 | +0.5 | −1.0 ~ 0.0 | 0.0 |
| −1.0 ~ 0.0 | −0.5 | 0.0 ~ +1.0 | 0.0 |
| −1.0 | −1.0 | +0.5 ~ +1.5 | −0.25 |

TABLE 9

| FEEDBACK QUANTITY β | C |
|---|---|
| +1 ≦ β | +1 |
| 0 ≦ β < +1 | 0 |
| −1 ≦ β < 0 | −1 |

TABLE 9-continued

| FEEDBACK QUANTITY β | C |
|---|---|
| β < −1 | −2 |

TABLE 11

| INPUT | OUTPUT |
|---|---|
| 57344 OR MORE | +4 |
| 40956 ~ 57343 | +3 |
| 24576 ~ 40959 | +2 |
| 8191 ~ 24575 | +1 |
| −8192 ~ 8191 | 0 |
| −24576 ~ −8193 | −1 |
| −24577 ~ −40960 | −2 |
| −40961 ~ −57344 | −3 |
| −57345 OR LESS | −4 |

TABLE 12

| CONTROL INPUT | UPPER LIMIT | LOWER LIMIT |
|---|---|---|
| +1 | +2 | −4 |
| 0 | +3 | −3 |
| −1 | +4 | −2 |

TABLE 10

| INPUT | | | | OUTPUT |
|---|---|---|---|---|
| C = −2 | C = −1 | C = 0 | C = 1 | |
| +3.5 OR MORE | +3.0 OR MORE | +2.0 OR MORE | +1.5 OR MORE | +3 |
| +2.5 ~ +3.5 | +2.0 ~ +3.0 | +1.0 ~ +2.0 | +0.5 ~ +1.5 | +2 |
| +1.5 ~ +2.5 | +1.0 ~ +2.0 | +0.0 ~ +1.0 | −0.5 ~ +0.5 | +1 |
| +0.5 ~ +1.5 | 0.0 ~ +1.0 | −1.0 ~ +0.0 | −1.5 ~ −0.5 | 0 |
| −0.5 ~ +1.5 | −1.0 ~ 0.0 | −2.0 ~ −1.0 | −2.5 ~ −1.5 | −1 |
| −1.5 ~ −0.5 | −2.0 ~ −1.0 | −3.0 ~ −2.0 | −3.5 ~ −2.5 | −2 |
| −1.5 OR LESS | −2.0 OR LESS | −3.0 OR LESS | −3.5 OR LESS | −3 |

TABLE 13

| INPUT | OUTPUT |
|---|---|
| 40956 | +3 |
| 24576 ~ 40959 | +2 |
| 8191 ~ 24575 | +1 |
| −8192 ~ 8191 | 0 |
| −24576 ~ −8193 | −1 |
| −24577 ~ −40960 | −2 |
| −40961 | −3 |

TABLE 14

| INPUT | OUTPUT |
|---|---|
| 50688 ~ | +5 |
| 39424 ~ 50687 | +4 |
| 28160 ~ 39423 | +3 |
| 16896 ~ 28159 | +2 |
| 5632 ~ 16895 | +1 |
| −5632 ~ 5631 | 0 |
| −16896 ~ −5633 | −1 |
| −28160 ~ −16897 | −2 |
| −39424 ~ −28161 | −3 |
| −50688 ~ −39425 | −4 |
| ~ −50689 | −5 |

TABLE 15

| INPUT | OUTPUT |
|---|---|
| 5632 ~ | +1 |
| −5632 ~ 5631 | 0 |
| ~ −5633 | −1 |

TABLE 16

| EQUATION No. | COEFFICIENTS | | | | | | GAIN | DYNAMIC RANGE (dB) |
|---|---|---|---|---|---|---|---|---|
| | A | B | C | K1 | K2 | K3 | | |
| 11 | −1 | ½ | 0 | −2 | 5/2 | −1 | 2.64 | 119 |
| 20 | −15/16 | ½ | 0 | −33/16 | 5/2 | −1 | 2.84 | 121 |
| 21 | −⅞ | ½ | 0 | −17/8 | 5/2 | −1 | 3.02 | 120 |
| 22 | −1 | ½ | −⅛ | −2 | 5/2 | −⅞ | 3.11 | 117 |
| 23 | −¾ | 7/16 | 0 | −9/4 | 41/16 | −1 | 3.18 | 123 |
| 24 | −⅞ | ½ | 1/16 | −17/8 | 5/2 | −17/16 | 3.14 | 121 |
| 25 | −⅞ | 3/8 | 0 | −19/8 | 21/8 | −1 | 3.37 | 123 |
| 26 | −¾ | 3/8 | ⅛ | −9/4 | 21/8 | −9/8 | 3.00 | 123 |
| 27 | −1 | 7/16 | 1/16 | −2 | 41/16 | −17/16 | 2.48 | 120 |

What is claimed is:

1. A noise shaping requantizing circuit coupled to receive an input digital signal (X), comprising:

a first delta-sigma quantizer coupled to receive said input digital signal, said first delta-sigma quantizer including a first local quantizer (1) and means (2) for detecting a quantization error of the first local quantizer;

a second delta-sigma quantizer including a second local quantizer (6) and detection means (8) for detecting a quantization error of the second local quantizer;

a feedback circuit (9) for multiplying said quantization error of the second local quantizer by a predetermined transfer function H(z) to obtain a feedback quantity (β);

adder means (7) for adding together said feedback quantity and quantization error of the first local quantizer to produce an input signal (P') of said second local quantizer;

control circuit means (11, 5) for adding to an output signal (Q) produced from the first local quantizer one of a plurality of predetermined values, said one value being selected in accordance with a current combination of values of said quantization error of the first local quantizer and said feedback quantity; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q2) produced by said control circuit means as a result of adding said selected value to said output signal from the first local quantizer, to obtain a final output signal (Y).

2. A noise shaping requantizing circuit according to claim 1, in which said control circuit means further includes amplitude limiter means (21) for limiting said output signal produced by the control circuit means to within a predetermined range of values.

3. A noise shaping requantizing circuit coupled to receive an input digital signal (X), comprising:

a first delta-sigma quantizer for executing noise shaping requantizing of said input digital signal, said first delta-sigma quantizer including a first local quantizer (1) and means (2) for detecting a quantization error of the first local quantizer;

a second delta-sigma quantizer including a second local quantizer (6) and detection means (8) for detecting a quantization error of the second local quantizer;

a feedback circuit (9) for multiplying said quantization error of the second local quantizer by a predetermined transfer function H(z) to obtain a feedback quantity (β);

adder means (7) for adding together said feedback quantity and quantization error of the first local quantizer to produce an input signal (P') of said second local quantizer;

control circuit means (15, 5) for adding to an output signal (Q) produced from the first local quantizer one of a plurality of predetermined values, said one value being selected in accordance with a current value of said feedback quantity; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q2) produced by said control circuit means as a result of adding said selected value to said output signal from the first local quantizer, to obtain a final output signal (Y).

4. A noise shaping requantizing circuit according to claim 3, in which said control circuit means further includes amplitude limiter means (21) for limiting said output signal produced by the control circuit means to within a predetermined range of values.

5. A noise shaping requantizing circuit coupled to receive an input digital signal (X), comprising:

a first delta-sigma quantizer for executing noise shaping requantizing of said input digital signal, said first delta-sigma quantizer including a first local quantizer (1) and means (2) for detecting a quantization error of the first local quantizer;

a second delta-sigma quantizer including a second local quantizer (6), and detection means (8) for detecting a quantization error of the second local quantizer;

a feedback circuit (9) for multiplying said quantization error of the second local quantizer by a predetermined transfer function H(z) to obtain a feedback quantity (β);

adder means (7) for adding together said feedback quantity and quantization error of the first local quantizer to produce an input signal (P') of said second local quantizer;

amplitude detection means (11) for outputting one of a plurality of predetermined values, said one value being selected in accordance with a current value of said feedback quantity, and adder means (25) for adding said selected value to an input signal of said first local quantizer; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said first local quantizer, to obtain a final output signal (Y).

6. A noise shaping requantizing circuit coupled to receive an input digital signal (X), comprising:

a first delta-sigma quantizer for executing noise shaping requantizing of said input digital signal, said first delta-sigma quantizer including a local quantization circuit (66) formed of a plurality of first local quantizers coupled to receive a common input signal and having respectively different sets of quantization threshold levels, and of selector means operable for selecting an output signal produced from one of said plurality of first local quantizers;

means (2) for detecting a quantization error of a currently selected one of said first local quantizers;

a second delta-sigma quantizer including a second local quantizer (6), and detection means (8) for detecting a quantization error of the second local quantizer;

a feedback circuit (9) for multiplying said quantization error of the second local quantizer by a predetermined transfer function H(z) to obtain a feedback quantity ($\beta$);

adder means (7) for adding together said feedback quantity and quantization error of the selected first local quantizer to produce an input signal (P') of said second local quantizer;

amplitude detection means (11) for outputting one of a plurality of predetermined values, said one value being selected in accordance with a current value of said feedback quantity, and being applied to said quantization circuit to control selection of one of said first local quantizers; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said selected first local quantizer, to obtain a final output signal (Y).

7. A noise shaping requantizing circuit coupled to receive an input digital signal (X), comprising:

a first delta-sigma quantizer for executing noise shaping requantizing of said input digital signal, said first delta-sigma quantizer including a local quantization circuit formed of a first local quantizer and of means operable for selecting one of a plurality of predetermined respectively different sets of quantization threshold levels for said first local quantizer;

means (2) for detecting a quantization error of the first local quantizer;

a second delta-sigma quantizer including a second local quantizer (6), and detection means (8) for detecting a quantization error of the second local quantizer;

a feedback circuit (9) for multiplying said quantization error of the second local quantizer by a predetermined transfer function H(z) to obtain a feedback quantity ($\beta$);

adder means (7) for adding together said feedback quantity and quantization error of the first local quantizer to produce an input signal (P') of said second local quantizer;

amplitude detection means (11) for outputting one of a plurality of predetermined values, said one value being selected in accordance with a current value of said feedback quantity, said value being applied to said quantization circuit of the first delta-sigma quantizer to control selection of one of said sets of threshold levels; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said first local quantizer, to obtain a final output signal (Y).

8. A noise shaping requantizing circuit coupled to receive an input digital signal (X), comprising:

a first delta-sigma quantizer for executing noise shaping requantizing of said input digital signal, said first delta-sigma quantizer including a first local quantizer (1) and means (2) for detecting a quantization error of the first local quantizer;

a second delta-sigma quantizer including a second local quantizer (6), and detection means (8) for detecting a quantization error of the second local quantizer;

a feedback circuit (9) for multiplying said quantization error of the second local quantizer by a predetermined transfer function H(z) to obtain a feedback quantity ($\beta$);

adder means (7) for adding together said feedback quantity and quantization error of the first local quantizer to produce an input signal (P') of said second local quantizer;

sign detection means (16) for outputting one of a plurality of predetermined values, said one value being selected in accordance with the polarity of said feedback quantity, and adder means (25) for adding said selected value to an input signal of said first local quantizer; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said first local quantizer, to obtain a final output signal (Y).

9. A noise shaping requantizing circuit according to claim 8, in which said plurality of predetermined values comprise a positive value and a negative value each having an amplitude that is one-half of a quantization step size of said first local quantizer.

10. A noise shaping requantizing circuit coupled to receive an input digital signal (X), comprising:

a first delta-sigma quantizer for executing noise shaping requantizing of said input digital signal, said first delta-sigma quantizer including a local quantizer circuit (18) and means for detecting a quantization error ($-Vql$) of the first local quantizer;

a second delta-sigma quantizer (23) for executing noise shaping of said quantization error produced by said first delta-sigma quantizer; and differentiator means (10) for differentiating an output signal produced from said second delta-sigma quantizer, and adder means (12) for adding together an output signal produced from said differentiator means and an output signal (Q1) produced by said local quantizer circuit of the first delta-sigma quantizer to obtain a final output signal (Y);

in which a signal indicating a current operating condition of said differentiator means is applied to said local quantizer circuit to determine an upper limit and a lower limit of said output signal produced from said local quantizer circuit.

11. A noise shaping requantizing circuit coupled to receive an input digital signal (X), comprising:

a first delta-sigma quantizer for executing noise shaping requantizing of said input digital signal, said first delta-sigma quantizer including a first local quantizer (51) and means (2) for detecting a quantization error of the first local quantizer;

a second delta-sigma quantizer including a second local quantizer (52), and detection means (8) for detecting a quantization error of the second local quantizer;

a feedback circuit (9) for multiplying said quantization error of the second local quantizer by a predetermined transfer function H(z) to obtain a feedback quantity (β);

adder means (7) for adding together said feedback quantity and quantization error of the first local quantizer to produce an input signal (P') of said second local quantizer;

adder means (25) for adding said feedback quantity to an input signal of said first local quantizer; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said first local quantizer, to obtain a final output signal (Y);

in which said differentiator means includes a delay element (14) for providing a unit delay, and a subtractor (13) coupled to receive a delayed output signal from said delay element, and in which said delayed output signal is applied to said first local quantizer for controlling upper and lower limits of output signal values produced from said first local quantizer.

12. A noise shaping requantizing circuit coupled to receive an input digital signal (X), comprising:

a first delta-sigma quantizer for executing noise shaping requantizing of said input digital signal, said first delta-sigma quantizer including a first local quantizer (18);

a second delta-sigma quantizer including a second local quantizer (6) and coupled to receive a quantization error produced from said first delta-sigma quantizer;

means (47, 25) for applying feedback control of said first delta-sigma quantizer in accordance with an internal condition of said second delta-sigma quantizer such as to ensure correct operation of said second delta-sigma quantizer; and differentiator means (10) for differentiating an output signal produced from said second local quantizer, with an order of differentiation that is in accordance with an order of noise shaping executed by said second delta-sigma quantizer, and adder means (12) for adding together an output signal produced from said differentiator means and an output signal (Q1) produced by said first local quantizer, to obtain a final output signal (Y);

in which said differentiator means comprises a delay element (14) for providing a unit delay, and a subtractor (13) coupled to receive a delayed output signal from said delay element, and in which said delayed output signal is applied to said first local quantizer for controlling upper and lower limits of output signal values produced from said first local quantizer.

13. A noise shaping requantizing circuit coupled to receive an input digital signal, comprising:

a first delta-sigma quantizer for executing noise shaping requantizing of said input digital signal, said first delta-sigma quantizer including a first local quantizer and means for detecting a quantization error of the first local quantizer;

a second delta-sigma quantizer including a second local quantizer and detection means for detecting a quantization error of the second local quantizer;

a feedback circuit for multiplying said quantization error of the second local quantizer by a predetermined transfer function H(z) to obtain a feedback quantity;

adder means for adding together said feedback quantity and said quantization error of the first local quantizer to produce an input signal of said second local quantizer;

means for controlling said quantization error generated by the first local quantizer, in accordance with said feedback quantity, such as to ensure correct operation of said second delta-sigma quantizer; and differentiator means for differentiating an output signal produced from said second local quantizer, with an order of differentiation that is in accordance with an order of noise shaping executed by said second delta-sigma quantizer, and adder means for adding together an output signal produced from said differentiator means and an output signal from the first local quantizer, to obtain a final output signal.

14. A noise shaping requantizer according to claim 13, in which said transfer function H(z) is expressed by the following equation:

$$H(z) = \frac{-2z^{-1} + 2.5z^{-2} - z^{-3}}{1 - z^{-1} + 0.5z^{-2}}.$$

* * * * *